United States Patent [19]

Nakano

[11] Patent Number: 5,260,169
[45] Date of Patent: Nov. 9, 1993

[54] METHOD FOR MANUFACTURING SEMICONDUCTOR DEVICE

[75] Inventor: Hirofumi Nakano, Itami, Japan

[73] Assignee: Mitsubishi Denki Kabushiki Kaisha, Tokyo, Japan

[21] Appl. No.: 780,356

[22] Filed: Oct. 22, 1991

[30] Foreign Application Priority Data

Feb. 5, 1991 [JP] Japan .................................. 3-38087

[51] Int. Cl.$^5$ .......................... G03C 5/00; H01L 21/46
[52] U.S. Cl. ...................................... 430/314; 430/311; 430/313; 430/316; 430/318; 156/625; 156/644; 427/58; 427/123; 437/225; 437/228; 437/229; 437/230; 437/245
[58] Field of Search ............... 430/311, 312, 313, 314, 430/316, 318, 329; 427/58, 123; 437/225, 228, 229, 230, 245; 156/625, 644, 654, 659.1

[56] References Cited

U.S. PATENT DOCUMENTS

| | | | |
|---|---|---|---|
| 3,969,745 | 7/1976 | Blocker, III | 357/55 |
| 3,986,196 | 10/1976 | Decker | 357/22 |
| 4,403,241 | 9/1983 | Butherus | 357/55 |
| 4,445,978 | 5/1984 | Whartenby et al. | 204/15 |
| 4,752,555 | 6/1988 | Takada | 430/314 |
| 4,842,699 | 6/1989 | Hua et al. | 204/15 |
| 4,978,639 | 12/1990 | Hua et al. | 437/230 |
| 5,053,318 | 10/1991 | Gulla | 430/313 |

OTHER PUBLICATIONS

Sumitani et al, "A High Aspect Ratio Via Hole Dry Etching Technology For High Power GaAs MESFET", IEEE Gallium Arsenide Integrated Circuit Symposium, Oct. 1989, pp. 207-210.

Primary Examiner—Marion E. McCamish
Assistant Examiner—Kathleen Duda
Attorney, Agent, or Firm—Leydig, Voit & Mayer

[57] ABSTRACT

A method for manufacturing a semiconductor device having a via hole penetrating a semiconductor substrate and electrically and thermally connecting an electrode of an element disposed on a front surface of the substrate to a metal layer disposed on a back surface of the substrate includes forming on the front surface of the substrate a metal pattern having an opening at a region where the via hole is to be formed and connected to a part of the electrode of the element, forming a hole, and forming a metal film connected to the metal pattern on the inside surface of the hole. The metal pattern can be formed using a positive resist on a flat substrate whereby a highly precise pattern is obtained.

8 Claims, 20 Drawing Sheets

METHOD FOR MANUFACTURING SEMICONDUCTOR DEVICE

FIELD OF THE INVENTION

The present invention relates to a method for manufacturing a semiconductor device and, more particularly, to forming a via hole penetrating a semiconductor substrate.

BACKGROUND OF THE INVENTION

Some integrated semiconductor devices including a high power output field effect transistor (FET), a high frequency power FET or the like, include a plated heat sink (PHS) the PHS is formed on a back surface of a chip and connected to a source of the FET on the front surface of the chip through a via hole penetrating a substrate. The via hole reduces the source inductance of the FET and assists in radiation heat.

FIG. 4 is a cross-sectional view showing an example of such a semiconductor device. In FIG. 4, reference numeral 101a designates a semiconductor substrate. A source diffusion region 106 and a drain diffusion region 105 are formed on a surface of the substrate 101a. A source electrode layer 110 and a drain electrode layer 108 are arranged on the source diffusion region 106 and on the drain diffusion region 105, respectively. In addition, a gate electrode layer 109 is arranged on an active region formed between the source diffusion region 106 and the drain diffusion region 105. A via hole 101b penetrates the substrate 101a and the source electrode layer 110 is connected to a first Au layer 112 formed on the back surface of the substrate 101a by a second Au layer 111 formed by plating.

FIGS. 5(a) to 5(l) are cross-sectional views showing steps of forming a via hole in accordance with a conventional method for manufacturing a semiconductor device. In these figures, reference numeral 201a designates a semiconductor substrate and reference numeral 201b designates a via hole formed in the semiconductor substrate 201a. A first resist 202 is used as a mask in forming the via hole 201b. Reference numeral 203 designates a second resist. A first metal film 204 serves as a feeding layer at the time of plating. A third resist 205 is used as a mask in forming a second metal film 206 by electrolytic plating.

Next, the conventional method will be described in reference to the drawings. As shown in FIG. 5(a), the first resist 202 is applied on the semiconductor substrate 201a on which an element such as a transistor is formed. Then, as shown in FIG. 5(b), an opening is formed in the first resist 202 by photolithography at a position where the via hole is to be formed. Then, as shown in FIG. 5(c), the via hole 201b is formed by dry etching. Thereafter, the first resist 202 is removed. Then, as shown in FIG. 5(d), the second resist 203 is applied to the entire surface. Thereafter, the second resist 203 is patterned as shown in FIG. 5(e) by usual photolithography. Then, as shown in FIG. 5(f), the metal film (Ti/Au laminated metal films or the like) 204 serving as the feeding layer is deposited on the entire surface by sputtering or the like. Then, as shown in FIG. 5(g), the third resist 205 serving as a mask at the time of plating is applied to the entire surface. Then, as shown in FIG. 5(h), a desired region of the third resist is removed by photolithography. Then as shown in FIG. 5(i), the metal film 206 is formed by electrolytic plating. Then, as shown in FIG. 5(j), the remaining third resist 205 is removed. Then, as shown in FIG. 5(k), the feeding layer 204 is removed using the metal film 206 as a mask. Then, the second resist 203 is removed. Thus, a structure shown in FIG. 5(l) can be obtained. In order to obtain the structure sown in FIG. 4, a bottom of the via hole 201a is exposed by grinding the back surface of the substrate 201a and then Au is plated onto the back surface of the substrate to form the PHS.

However, since the conventional method for manufacturing a semiconductor device is constituted as described above, it is necessary to pattern the resist after the via hole is formed. In this case, when the depth of the via hole is as deep as 30 to 100 microns, the resist is not evenly applied, so that the resist pattern can not be formed with high precision. In addition, since 20 microns or more of resist is applied in the via hole, the bottom of the via hole is not sufficiently exposed to light when a positive resist is used and the resist remains there. Therefore, it is necessary to use a negative resist as the plating mask. The negative resist has high absorptivity as compared with the positive resist and it swells during development. Therefore, its pattern precision is poor and its processing precision is not as high as that of the positive resist. In such a semiconductor device, when the metal film is formed in the via hole by plating, a plating pattern, such as wiring or another electrode, is formed at the same time, with the result that the process can be simplified in many cases. This plating uses pattern a mask pattern 2 to 3 microns wide. Therefore, the fact that the precision of the patterning of the resist is poor is a serious problem.

SUMMARY OF THE INVENTION

The present invention was made to solve the above problems and it is an object of the present invention to provide a pattern with high precision not influenced by the step difference of a via hole.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a metal pattern having an opening where a via hole is to be formed and connected to an electrode of an element that is connected to a metal layer formed on the back surface of a substrate through via hole, is formed on a surface of the substrate. Thereafter, the via hole is formed and then a metal film connected to the metal pattern on an internal surface of the via hole. Therefore, the metal pattern can be formed using a positive resist on a flat substrate, resulting in highly precise pattern.

According to another aspect of the present invention, the metal film is formed by electrolytic plating after a feeding layer is formed on the entire surface of the wafer including on the internal surface of the via hole. Therefore, a highly precise pattern is obtained and a thick, uniform metal film is formed in the via hole.

BRIEF DESCRIPTION OF THE DRAWINGS

FIGS. 5(a) to 5(l) are cross-sectional views showing process steps for forming a via hole in a method for manufacturing a semiconductor device in accordance with a prior art.

DETAILED DESCRIPTION OF THE PREFERRED EMBODIMENTS

Figure 1A:
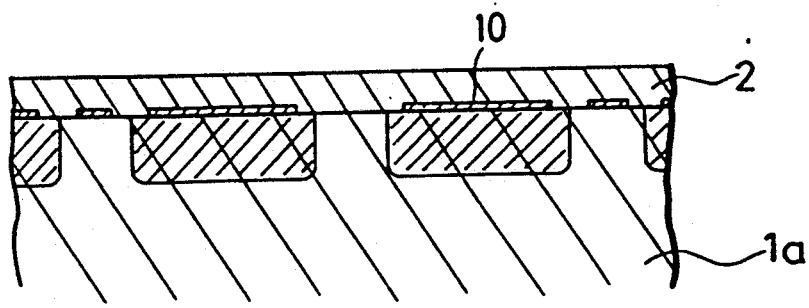
FIGS. 1(a) to 1(k) are cross-sectional views showing process steps for forming a via hole in a method for manufacturing a semiconductor device in accordance with a first embodiment of the present invention.

An embodiment of the present invention will be described in reference to the drawings hereinafter. FIGS. 1(a) to 1(k) are cross-sectional views showing process steps for forming a via hole in a method for manufacturing a semiconductor device in accordance with a first embodiment of the present invention.

In these figures, reference numeral 1a designates, for example, a GaAs semiconductor substrate having a front surface on which a high power output transistor or the like is formed. An electrode 10 of this high output transistor or the like on the front surface of the substrate 1a is connected to a heat sink layer formed on a back surface of the substrate opposite the front surface, through a via hole 1b. Reference numerals 2 and 4 designate a first resist and a second resist, respectively. Reference numeral 3 designates a first metal film serving as a feeding layer. Reference numeral 5 designates a second metal film formed by electrolytic plating and reference numeral 6 designates a third metal film formed by electroless plating.

Next, production flow for forming the via hole in accordance with this embodiment will be described in reference to the drawings.

Figure 1B:
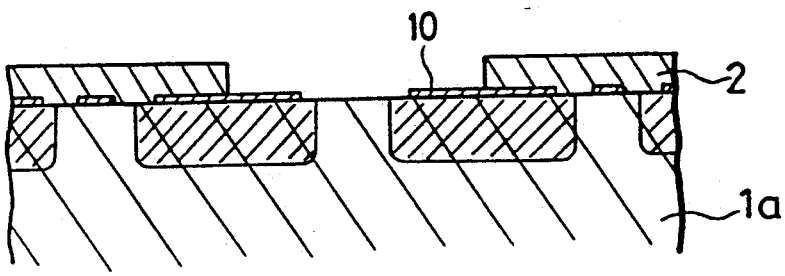
Figure 1C:
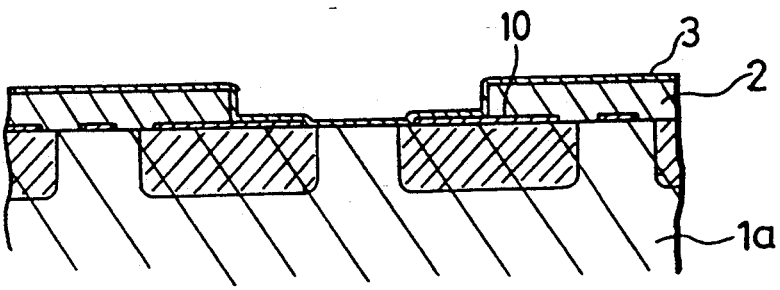
Figure 1D:
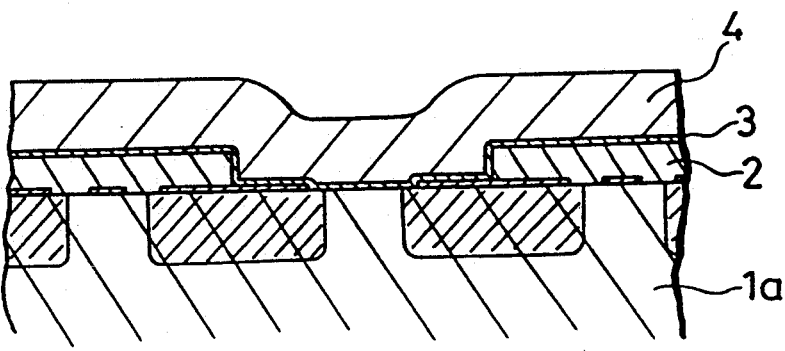
Figure 1:
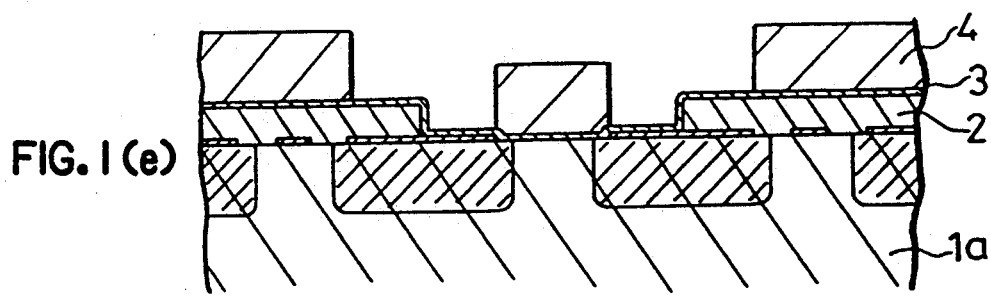
Figure 1:
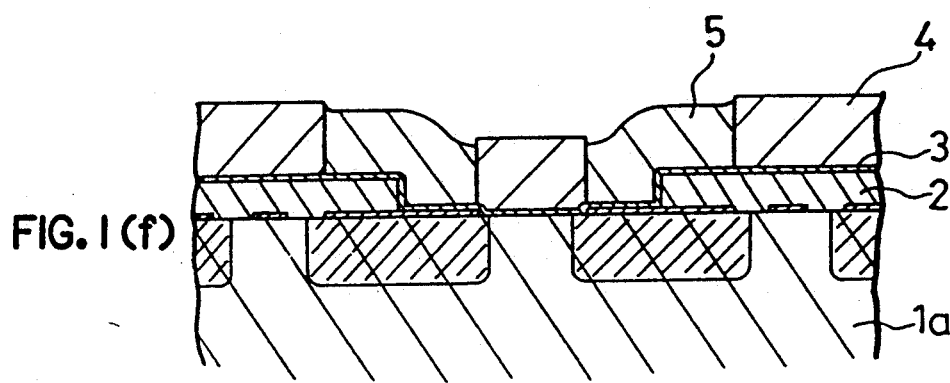
Figure 1:
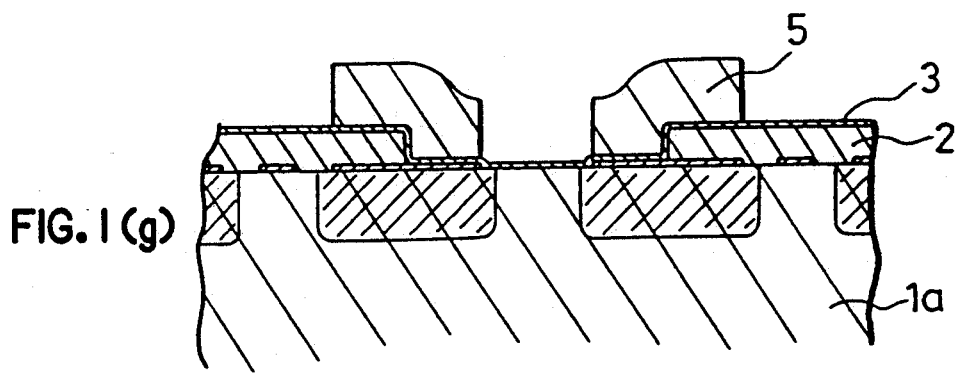
Figure 1:
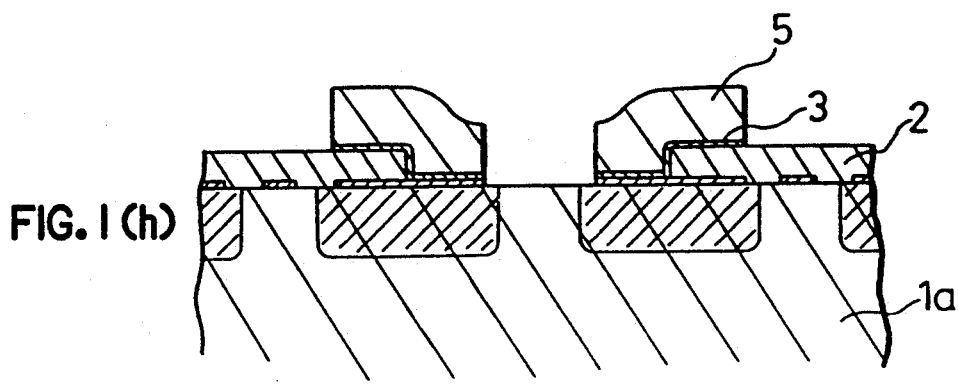
Figure 1:
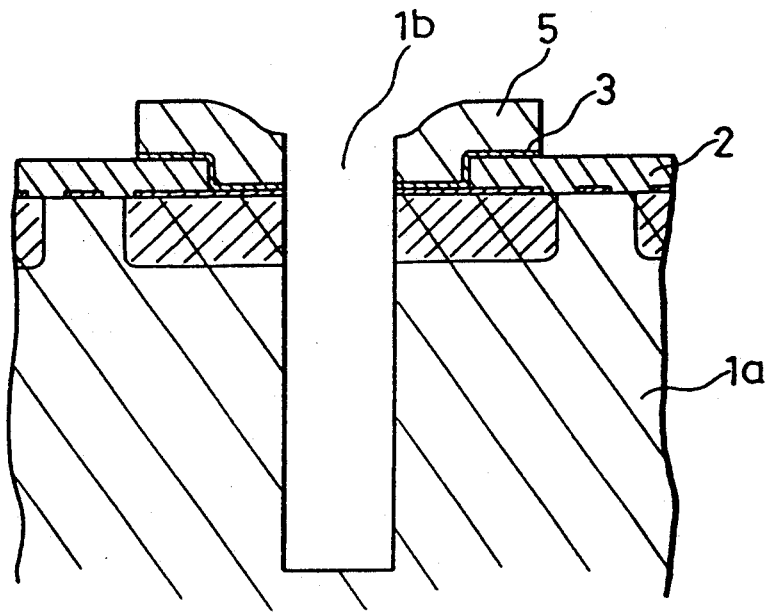
Figure 1:
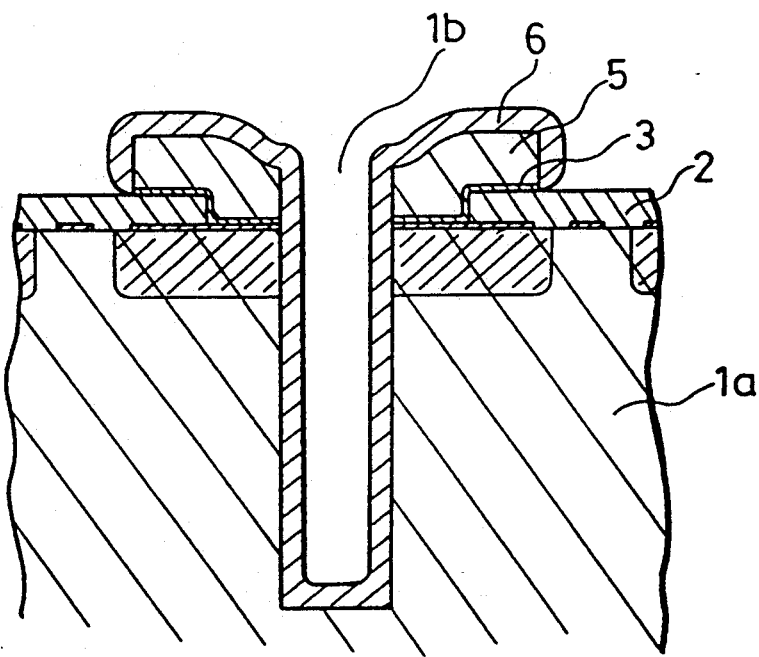
Figure 1K:
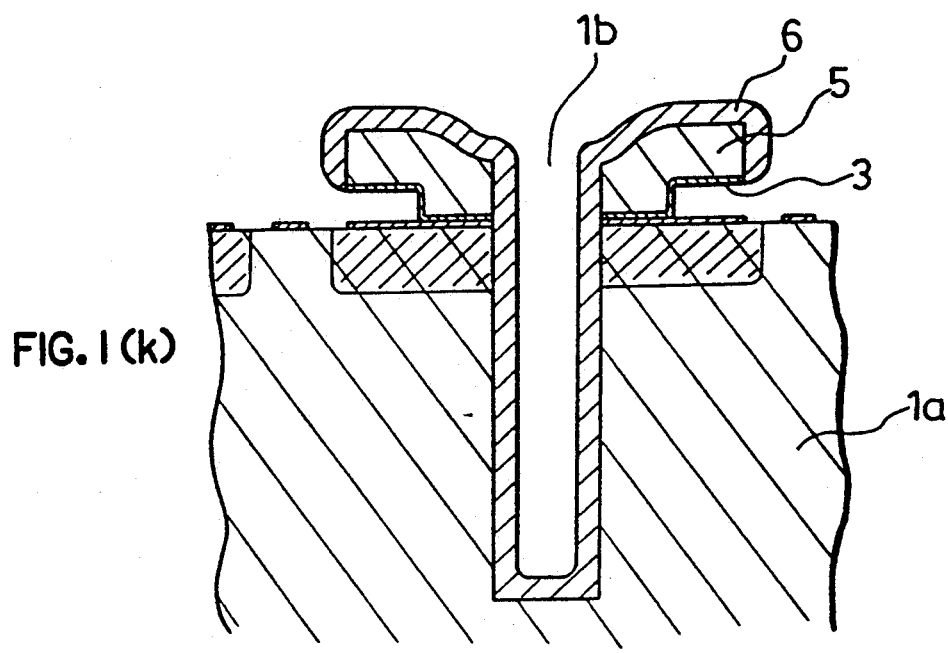
Figure 4:
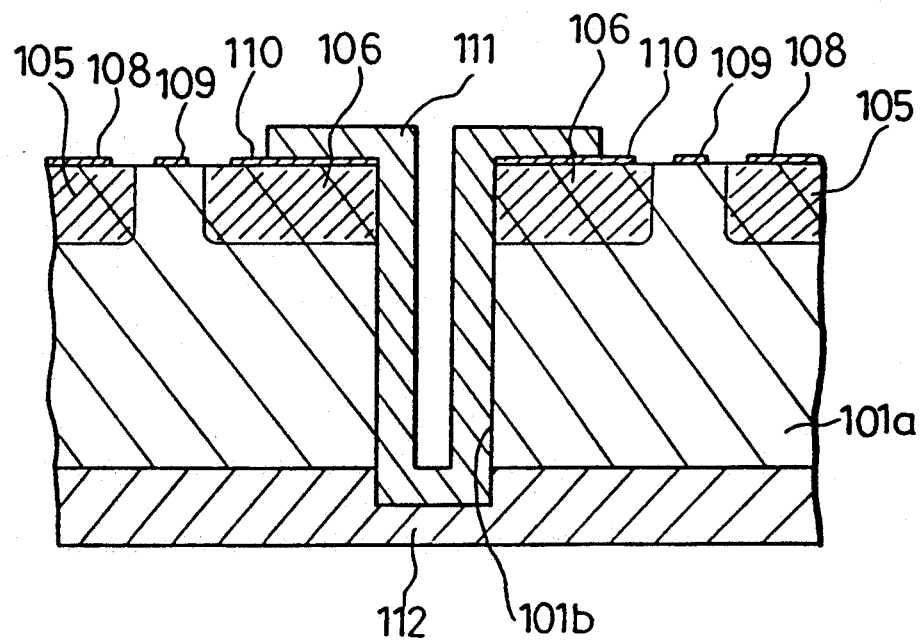
FIG. 4 is a view showing an example of a semiconductor device using a plated heat sink.
Figure 5A:
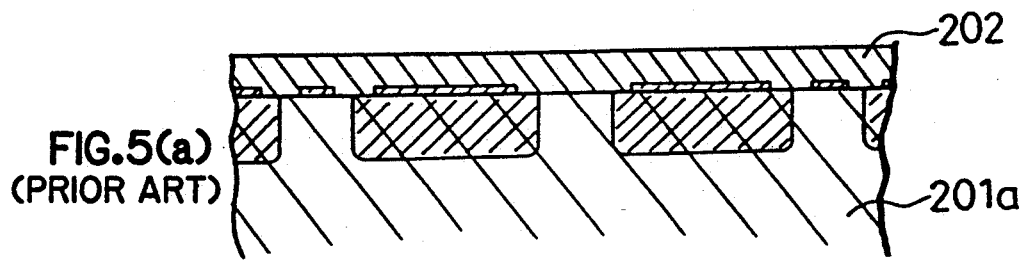
Figure 5B:
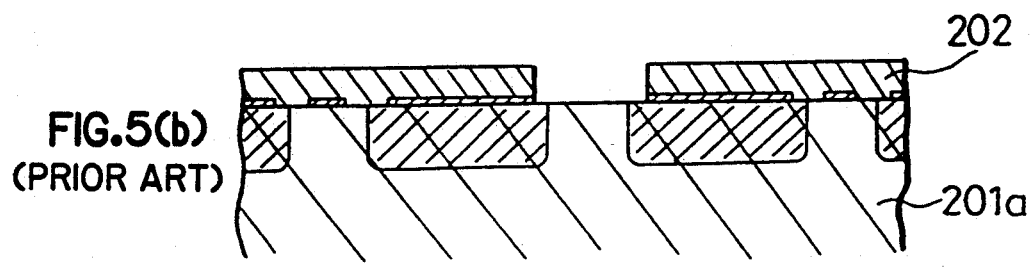
Figure 5C:
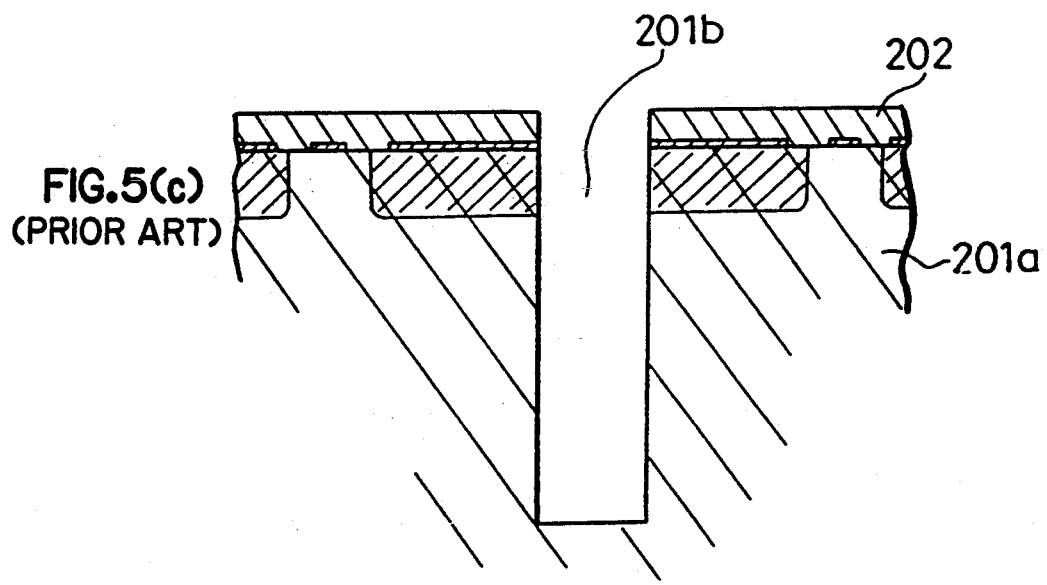
Figure 5D:
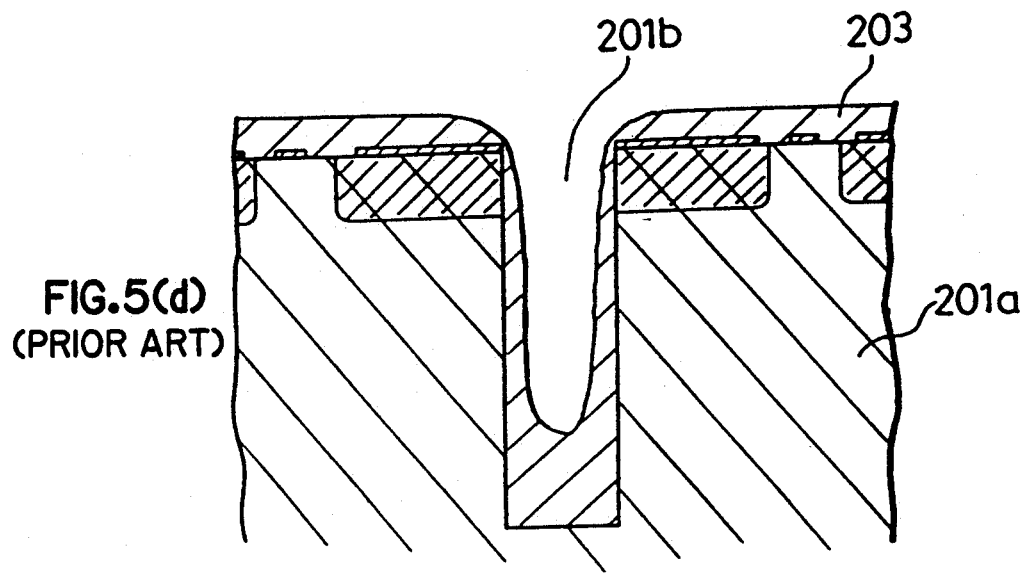
Figure 5E:
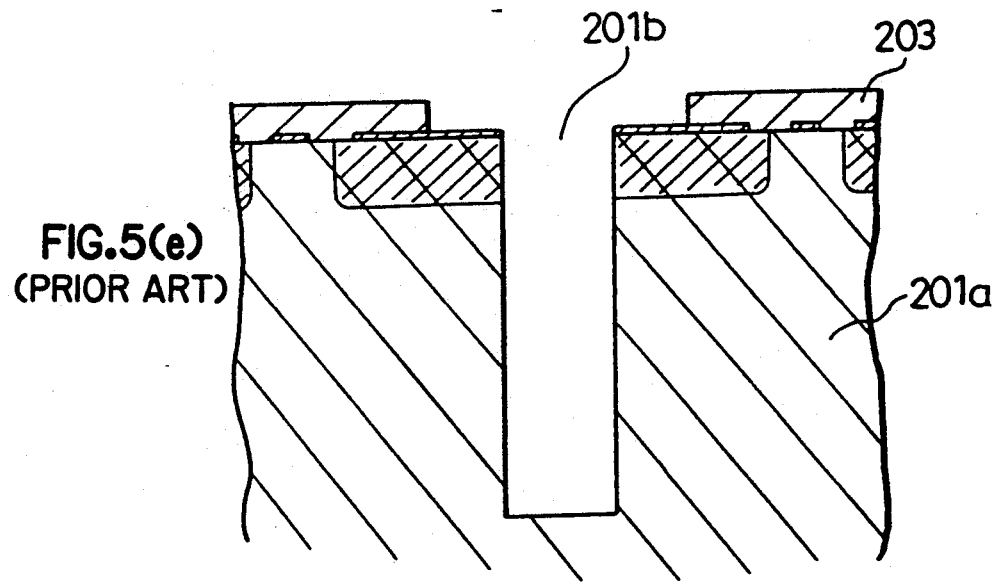
Figure 5F:
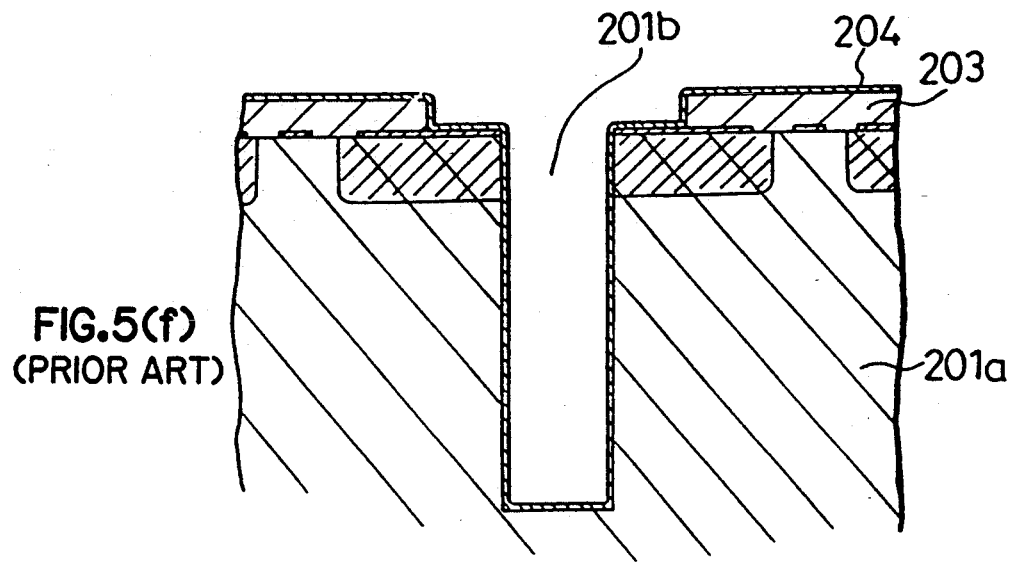
Figure 5G:
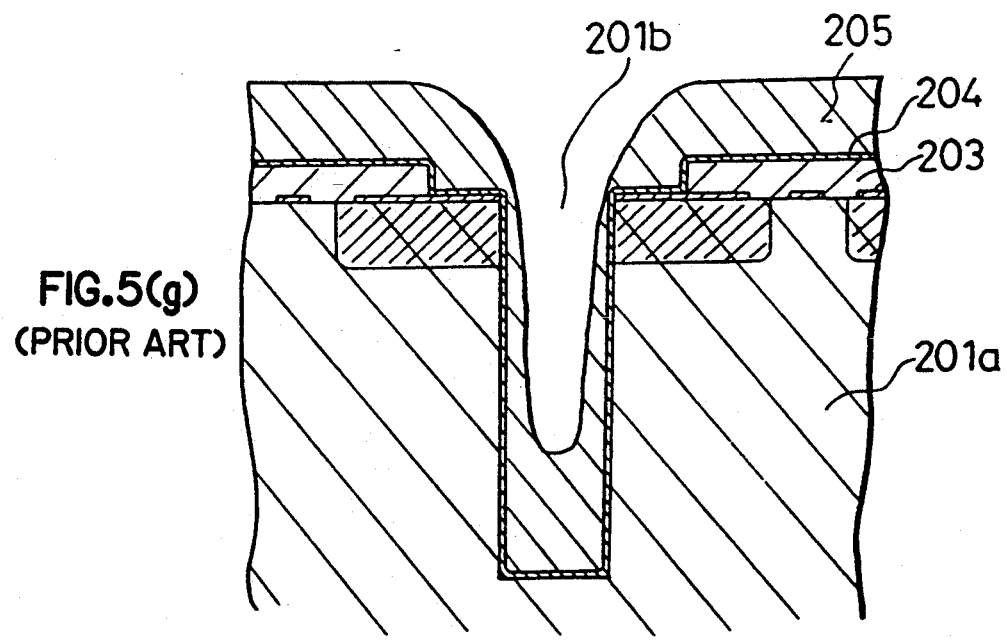
Figure 5H:
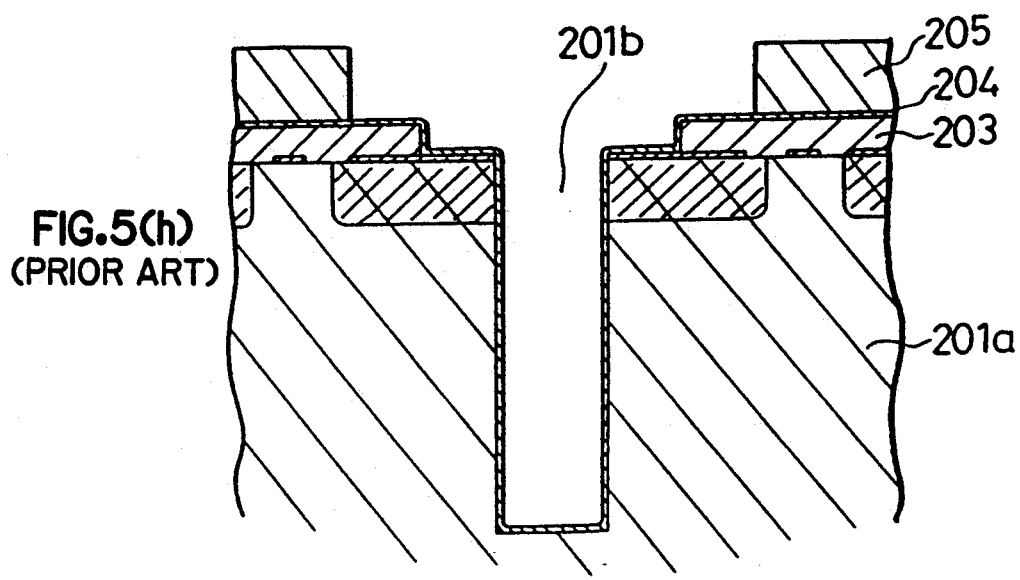
Figure 5I:
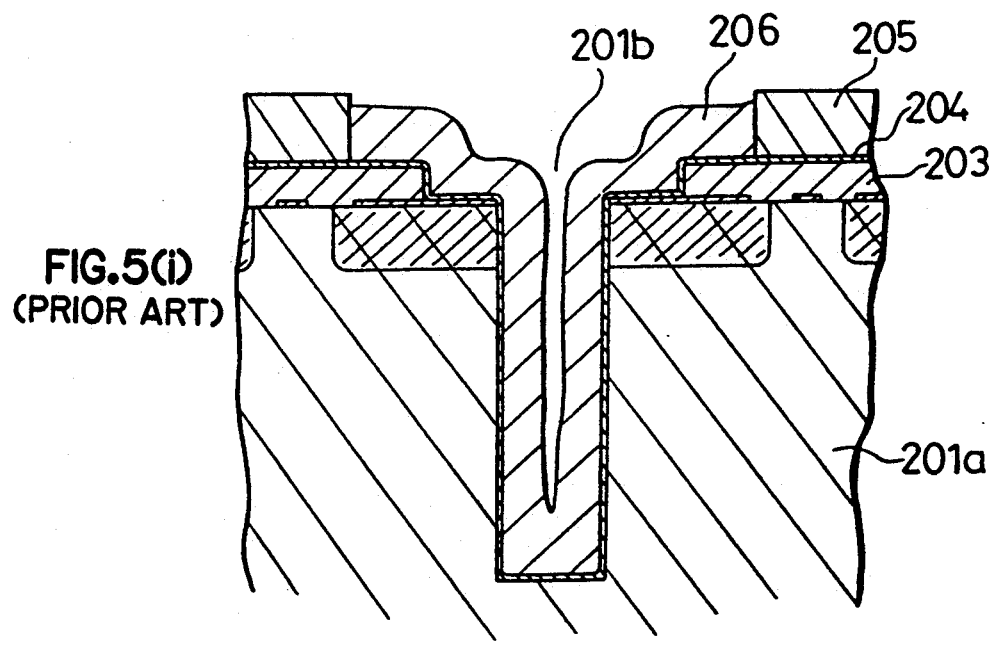
Figure 5J:
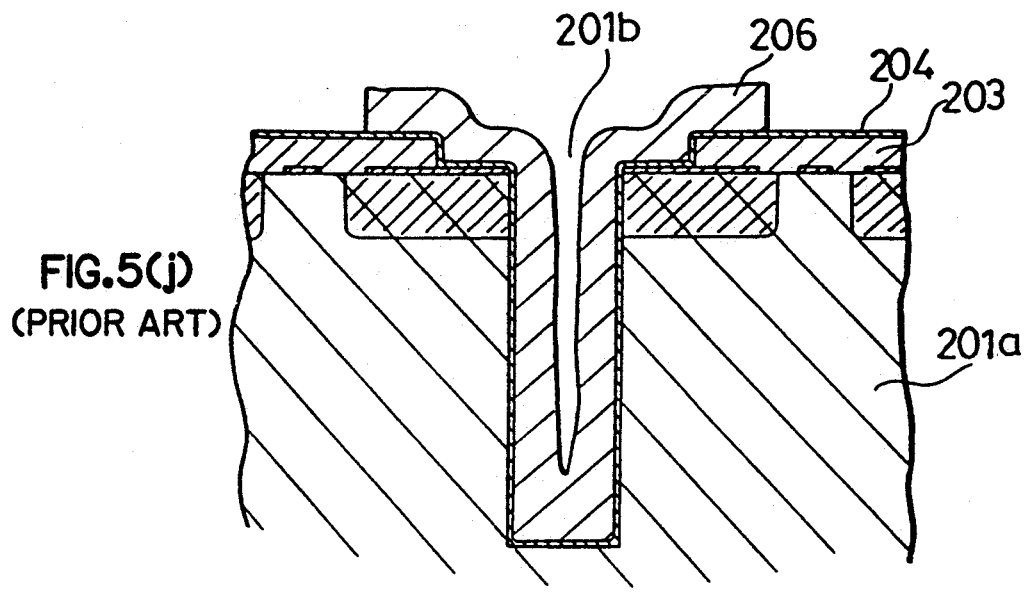
Figure 5K:
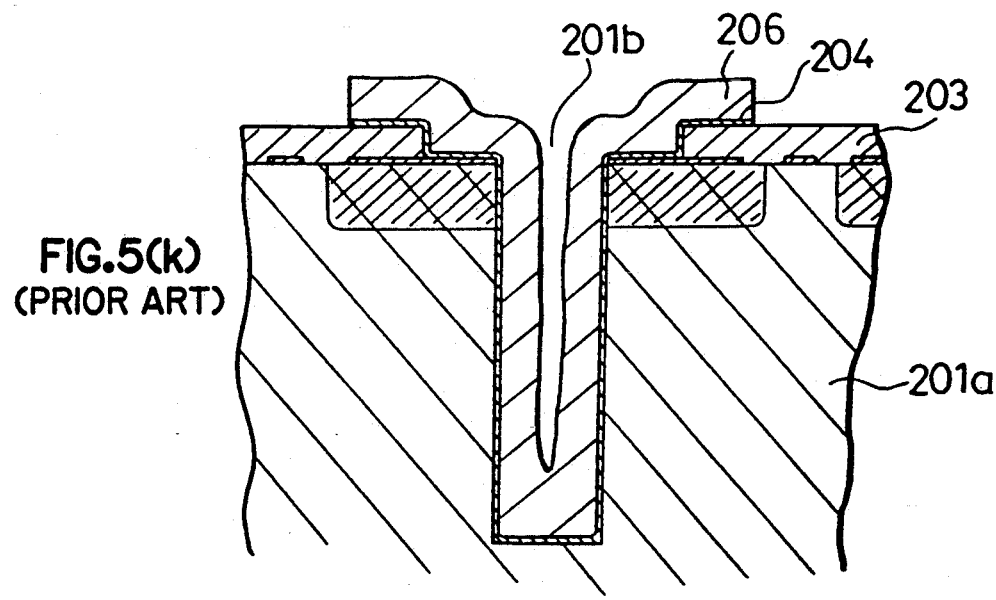
Figure 5I:
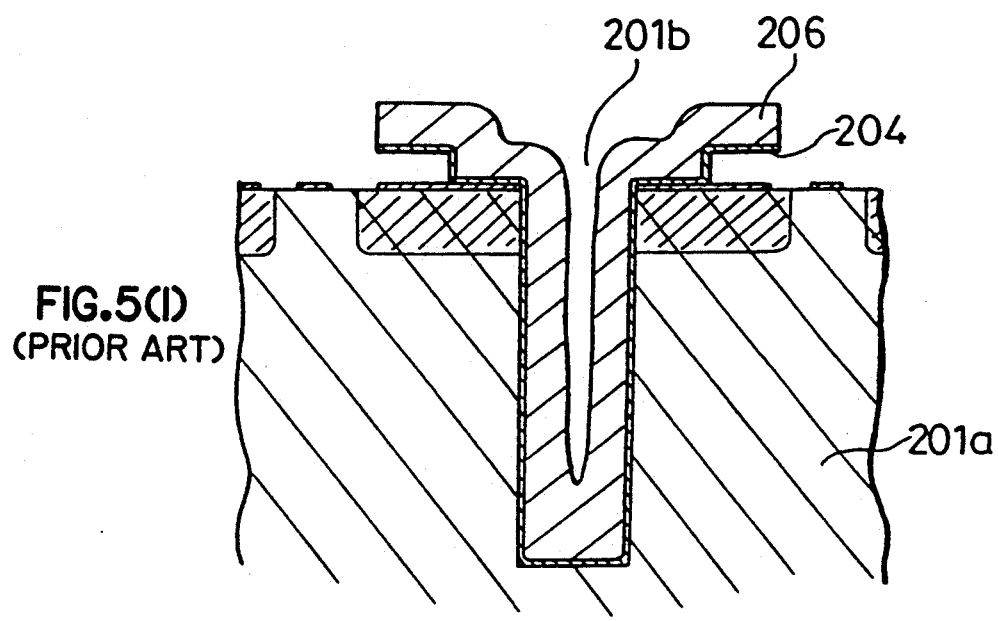

As shown in FIG. 1(a), a positive resist serving as a first resist 2 is applied to the entire front surface of the GaAs substrate 1a, including the electrode 10 on which an element such as a transistor is formed. Then, as shown in FIG. 1(b), the resist 2 is patterned by photolithography to form an opening at a predetermined region including a region of the substrate 1a of the front surface where the via hole is to be formed exposing part of the electrode 10. The diameter of the opening is approximately 30 microns. Thereafter, as shown in FIG. 1(c) a first metal film (laminated metal films of Ti/Au or the like) serving as a feeding layer is deposited on the resist 2 and the substrate 1a in the opening, and on part of the electrode 10 exposed by patterning the resist 2 by sputtering or the like. Its thickness is approximately 500 angstroms. Then, as shown in FIG. 1(d), a positive resist serving as a second resist 4 is applied to the entire surface of the metal film 3. The thickness of the resist 4 is 8 to 10 microns. Then, as shown in FIG. 1(e), the resist 4 is patterned by photolithography for example, with an annular opening, to form an opening in the vicinity of the region where the via hole is to be formed where the metal film 3 is exposed. More specifically, the resist 4 has a pattern which covers a part where plating is unnecessary and a region where the via hole is to be formed. In a case where the metal pattern is also formed at another region on the substrate, the resist 4 is desirably patterned there at this step. A diameter of the region where the via hole is to be formed is approximately 16 microns. In this state, electrolytic plating is performed using the metal film 3 as a feeding layer to form a second metal film 5 comprising Au as shown in FIG. 1(f). Then, the resist 4 is removed as shown in FIG. 1(g). Then, the first metal film 3 exposed on the surface is removed by etching as shown in FIG. 1(h). At this time although the metal film 5 is slightly etched at the same time, since the thickness of the metal film 5 is thicker by far than that of the metal film 3, it does not matter. Then, as shown in FIG. 1(i), the substrate 1a is etched using the metal film 5 and the resist 2 as a mask to form the via hole 1b having a depth of 30 to 100 microns. Thereafter, electroless plating is performed to form a metal film 6 covering the inner surface of the via hole 1b and the surface of the metal film 5 as shown in FIG. 1(j). The thickness of the metal film 6 is approximately 2 microns. Then, the second resist 2 is removed, resulting in a structure shown in FIG. 1(k). In order to obtain the device structure shown in FIG. 4, the bottom of the via hole 1b is exposed by grinding the back surface of the substrate 1a and then 5 to 10 microns of Au is deposited on the back surface of the substrate by plating vapor deposition or the like to form the PHS.

As described above, according to the first embodiment of the present invention, the metal film pattern is formed by electroless plating using a pattern of a positive resist applied to the front surface of the flat substrate before the via hole is formed, the via hole is formed by etching, and the metal film is deposited in the via hole so as to be connected to the metal film pattern. Thus, the electrolytically plated pattern can be formed with high precision. Accordingly, a plating pattern such as wiring at another region on the substrate can be formed at the same time with high precision in this process.

Figure 2A:
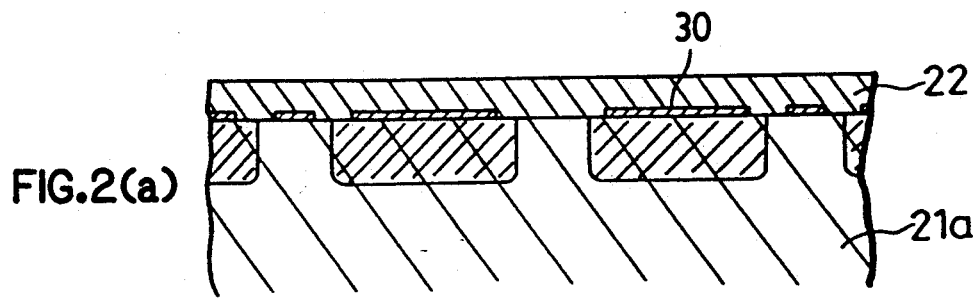
FIGS. 2(a) to 2(p) are cross-sectional views showing process steps for forming a via hole in a method for manufacturing a semiconductor device in accordance with a second embodiment of the present invention.
Figure 2B:
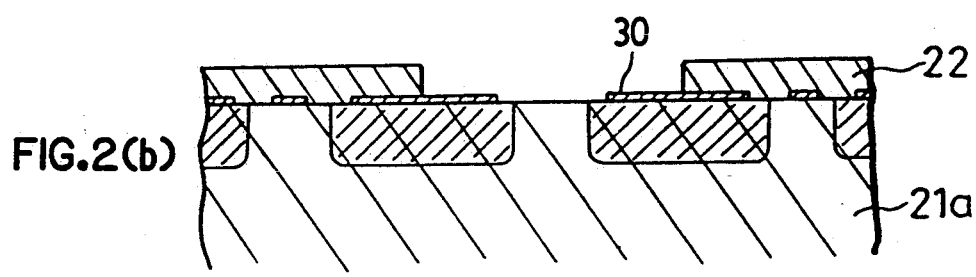
Figure 2C:
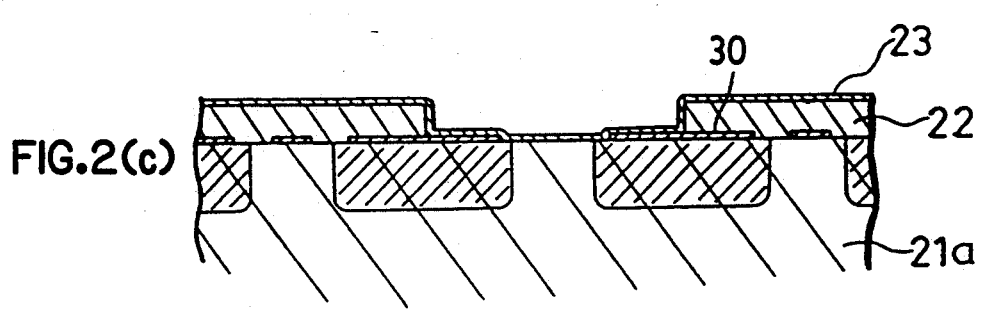
Figure 2D:
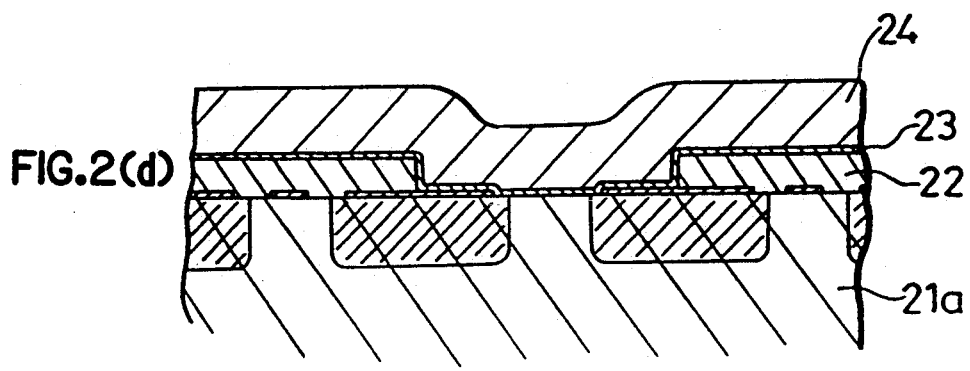
Figure 2E:
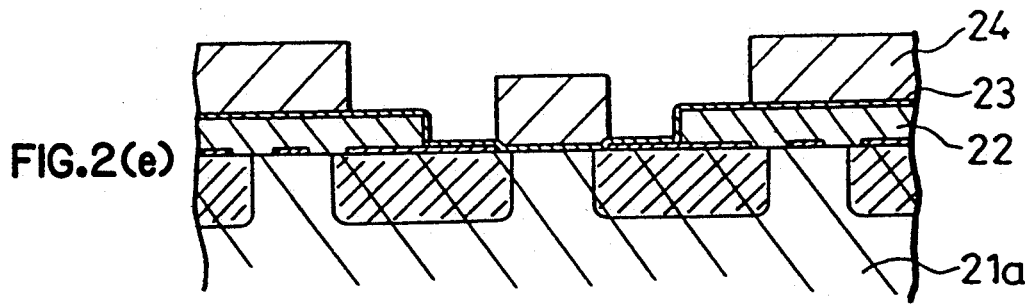
Figure 2F:
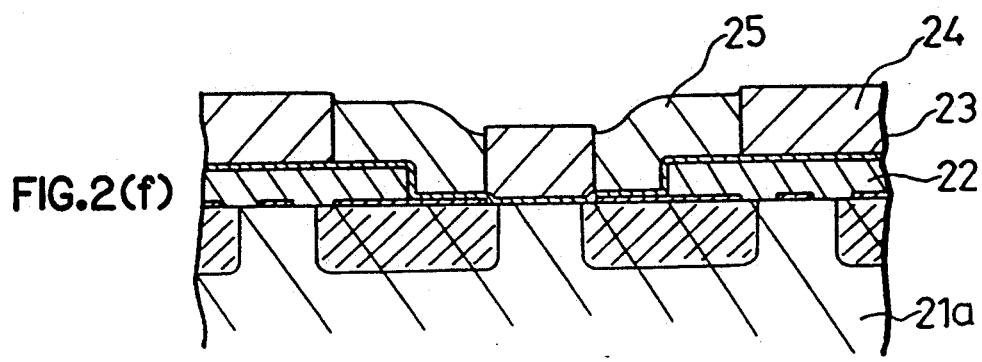
Figure 2G:
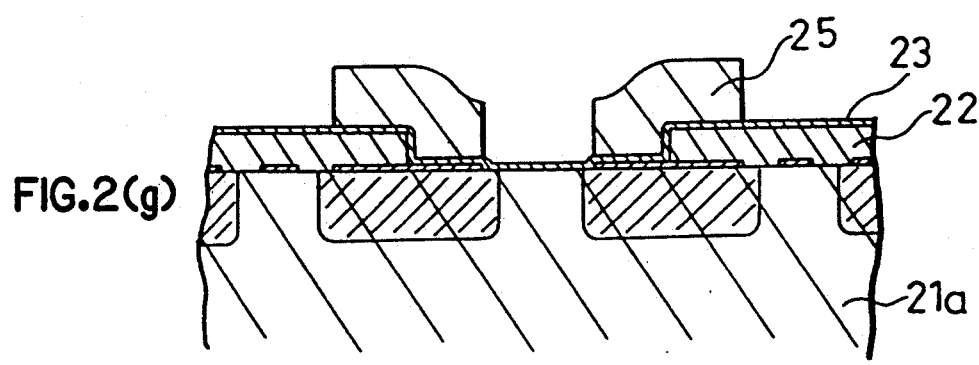
Figure 2H:
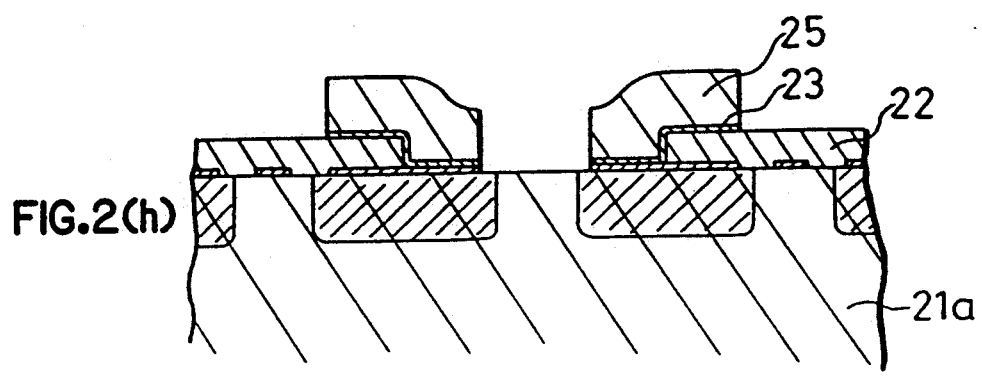
Figure 2I:
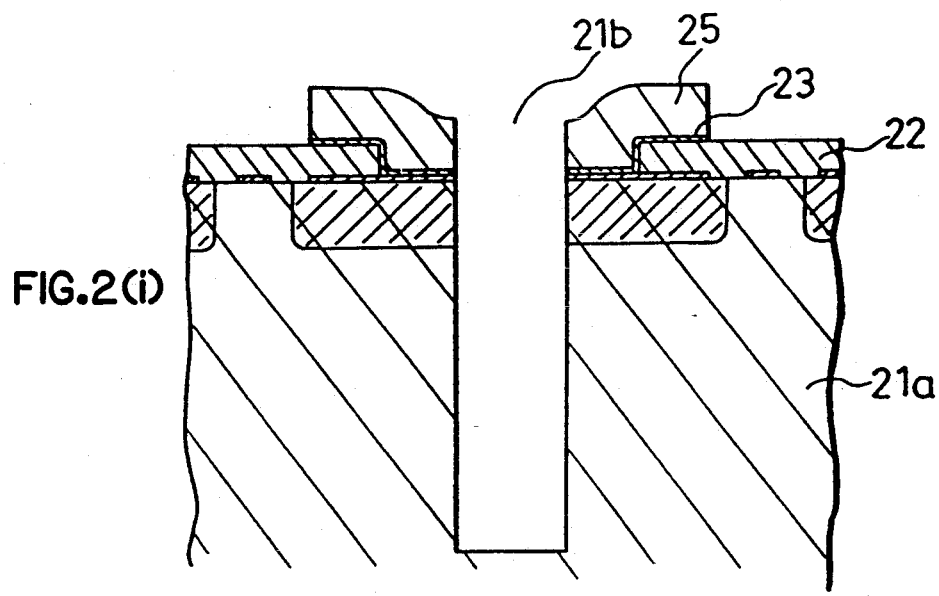
Figure 2J:
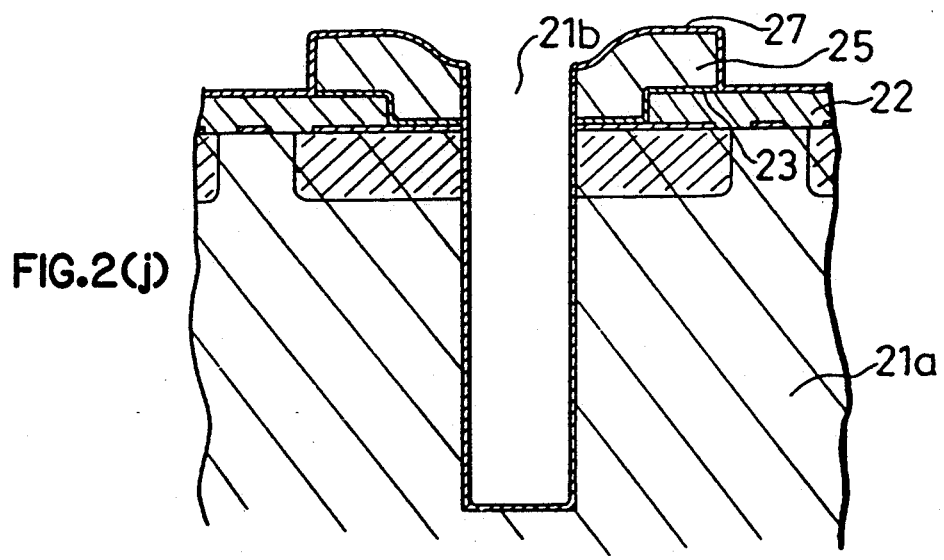
Figure 2K:
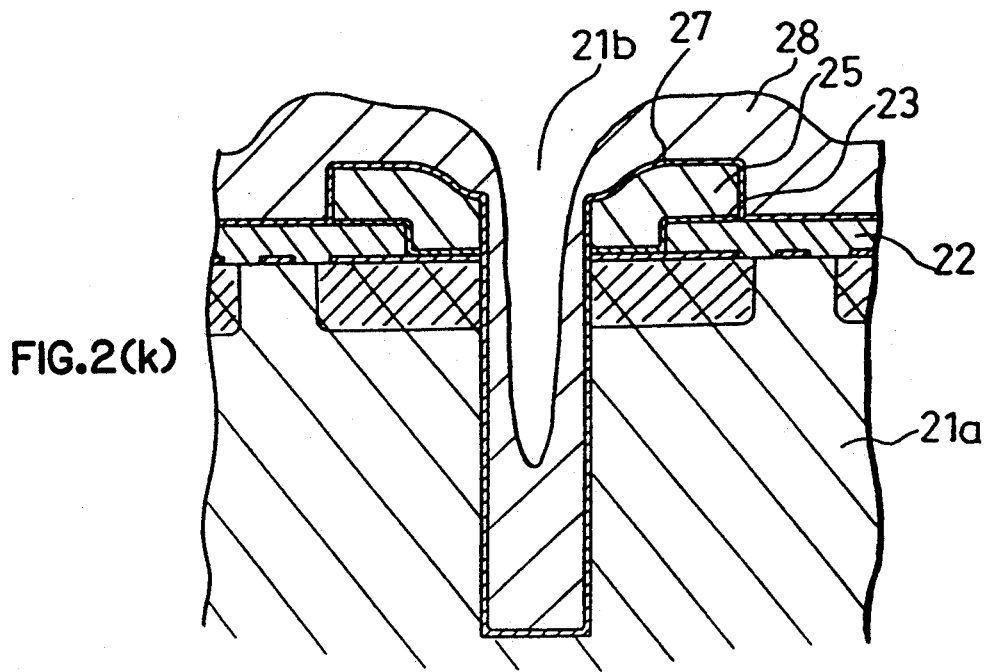
Figure 2L:
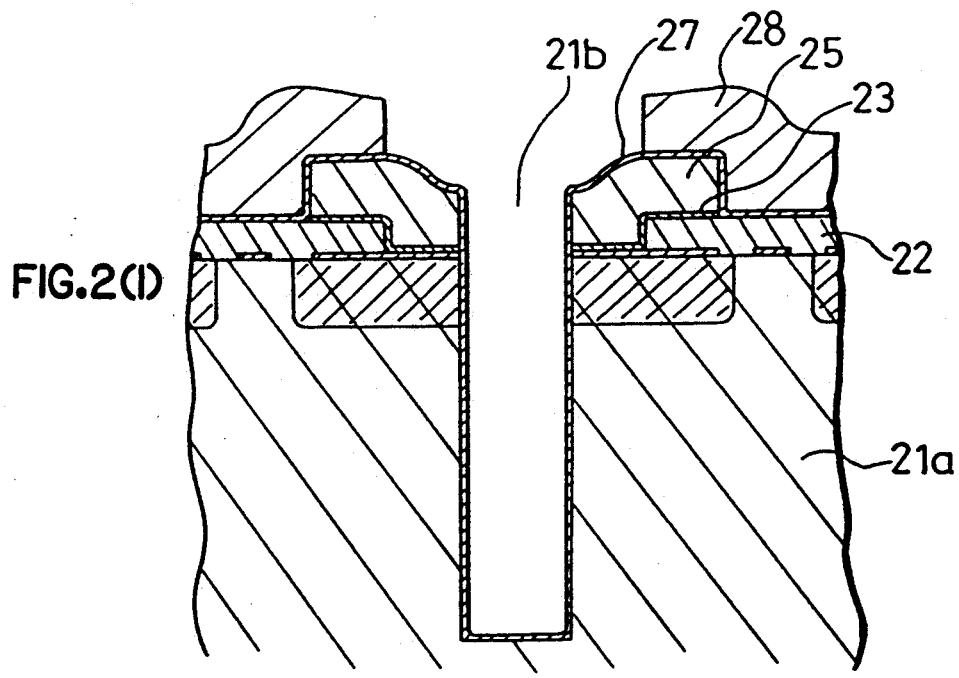
Figure 2M:
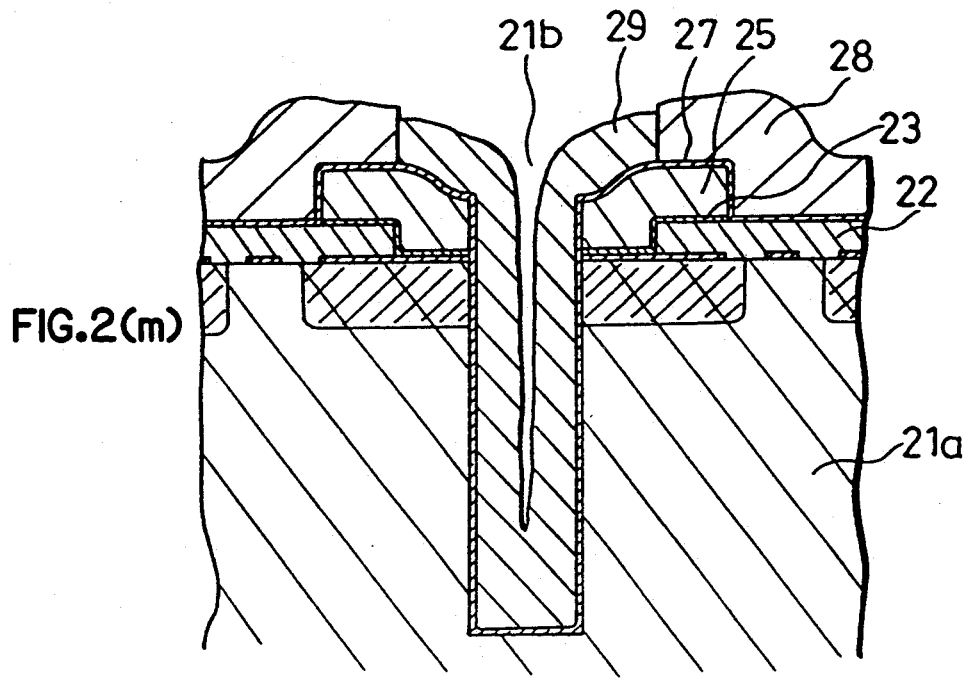
Figure 2N:
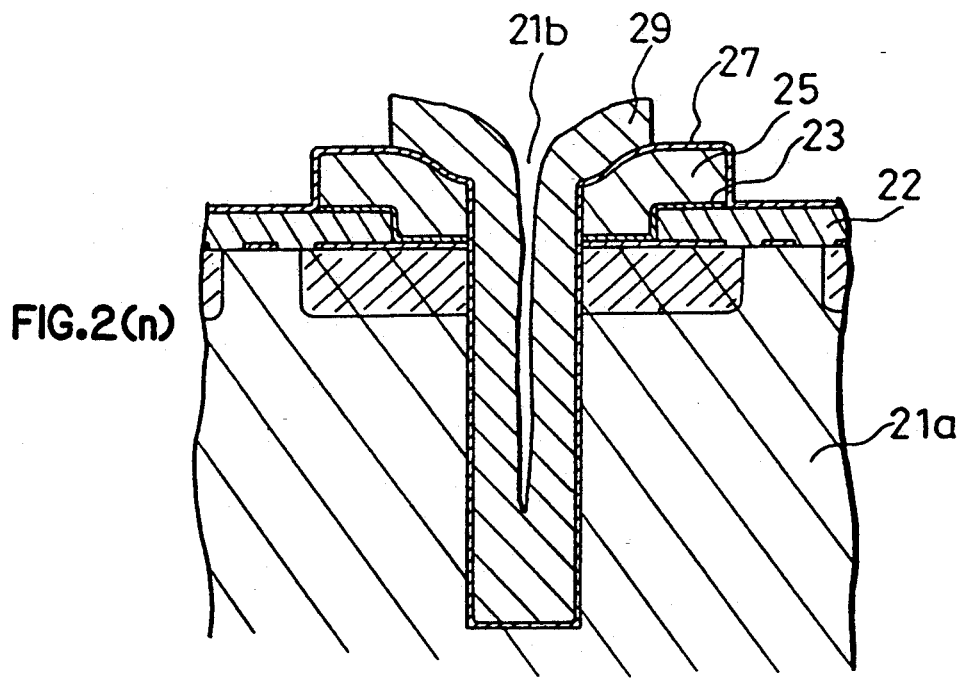
Figure 2O:
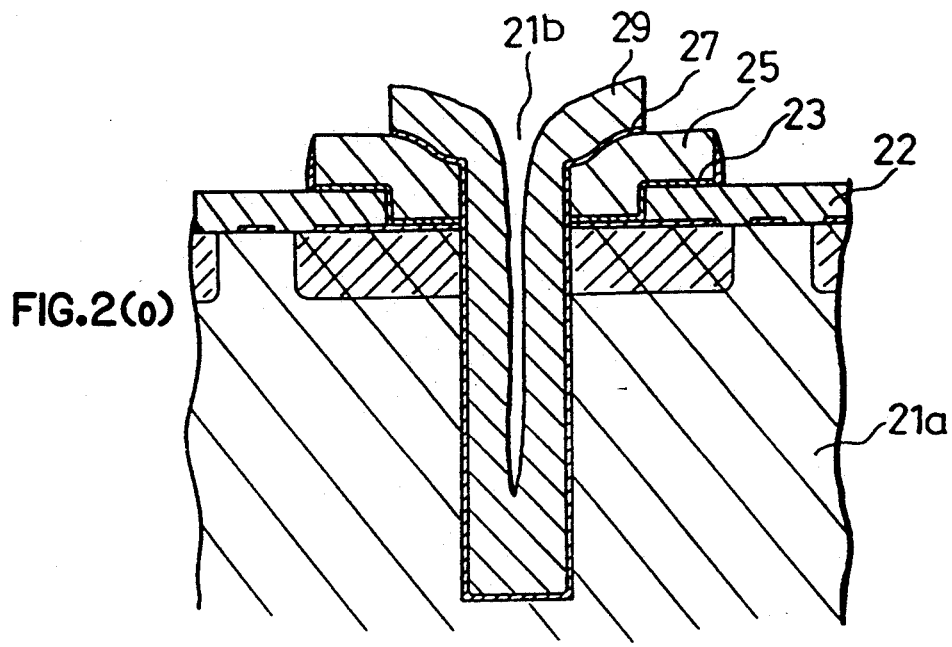
Figure 2P:
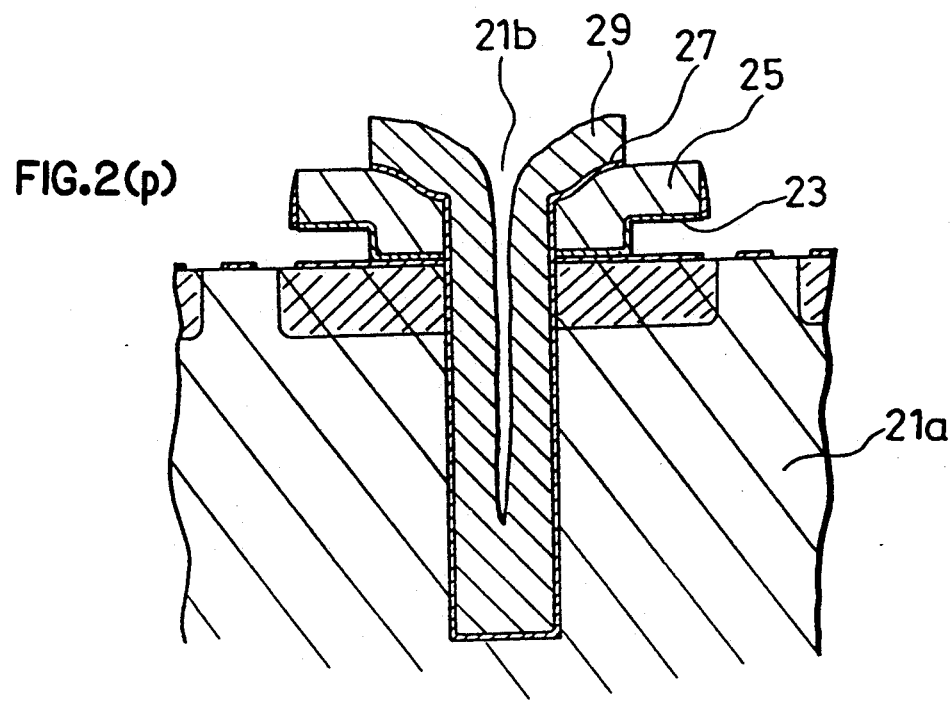

In this case, the metal film formed in the via hole is deposited by electroless plating and is as thin as approximately 2 microns. When the thickness of the metal in the via hole is increased, the efficiency of heat radiation is improved. FIGS. 2(a) to 2(p) are cross-sectional views showing process steps for forming a via hole in a method for manufacturing a semiconductor device in accordance with a second embodiment of the present invention, in which the thickness of the metal film in the via hole can be increased.

In these figures, reference numeral 21a designates, for example a GaAs semiconductor substrate having a front surface on which a high output transistor or the like is formed like the above-described first embodiment. An electrode 30 of the transistor or the like on the front surface of the substrate 21a is connected to a heat sink layer formed on the back surface of the substrate opposite the front surface, through a via hole 21b. Reference numerals 22, 24 and 28 designate a first resist, a second resist and a third resist, respectively. Reference numeral 23 designates a first metal film serving as a feeding layer. Reference numeral 25 designates a second electrolytically plated metal film. Reference numeral 27 designates a third metal film serving as a feeding layer. Reference numeral 29 designates a fourth electrolytically plated metal film.

Next, process steps for forming the via hole in accordance with this embodiment will be described in reference to the drawings. As shown in FIG. 2(a), a positive resist serving as a first resist 22 is applied to the entire front surface of the GaAs substrate 21a including the electrode 30 on which an element such as a transistor is formed. Then, as shown in FIG. 2(b), the resist 22 is patterned by photolithography to form an opening at a predetermined region of the front surface of the substrate 21a including a region where the via hole is to be formed. The diameter of the opening is approximately 30 microns. The opening is large enough that is exposes part of the electrode 30. Thereafter, as shown in FIG. 2(c), a first metal film (laminated metal films of Ti/Au or the like) 23 serving as a feeding layer is deposited on the entire surface i.e., the substrate 21a, the exposed part of the electrode 30, and the remaining resist 22, by sputtering or the like. Its thickness is approximately 5000 angstroms. Then, as shown in FIG. 2(d), a positive resist, i.e., second resist 24, is applied to the entire surface of the metal film 23. The thickness of the resist 24 is 8 to 10 microns. Then, as shown in FIG. 2(e), the resist 24 is patterned by photolithography to form an opening for example, an annular opening, in the vicinity of the region where the via hole is to be formed, whereby the metal film 23 is exposed. More specifically, the resist 24 has a pattern which covers a part where plating is unnecessary and a region where the via hole is to be formed. In a case where the metal pattern is formed at another region on the substrate, the resist 24 is desirably patterned at this step. The diameter of the region where the via hole is to be formed is approximately 16 microns. In this state a second metal film 25 is deposited by electrolytic plating using the metal film 23 as a feeding layer. The second metal film 25 comprises, for example, Au as shown in FIG. 2(f). Then, the resist 24 is removed as shown in FIG. 2(g). Then, the first metal film 23 exposed on the surface is removed by etching as shown in FIG. 2(h). At this time, although the metal film 25 is slightly etched at the same time, since the thickness of the metal film 25 is thicker by far than that of the metal film 23, it does not matter. Then, the substrate 21a is etched using the metal film 25 and the resist 22 as a mask to form the via hole 21b whose depth is 30 to 100 microns as shown in FIG. 2(i). Thereafter, as shown in FIG. 2(j), a third metal film 27 serving as a second feeding layer (Ti/Au or the like) is formed on the entire surface by, for example, sputtering like the first metal film 23. Its thickness is approximately 5000 angstroms. In addition, as shown in FIG. 2(k), a negative resist serving as a third resist 28 which is used as a mask during the second electrolytic plating is applied to the entire surface to a thickness of 8 to 10 microns. Then, as shown in FIG. 2(l), the third resist 28 is patterned so that at least the via hole 21b is opened. Then, as shown in FIG. 2(m), a fourth metal film 29 comprising Au is formed by electrolytic plating. Thereafter, the resist 28 is removed as shown in FIG. 2(n). Then, as shown in FIG. 2(o), the unnecessary part of the metal film 27 is removed using the metal film 29 as a mask. Then, the resist 22 is removed. resulting in a structure shown in FIG. 2(p). In order to obtain the device structure shown in FIG. 4, the bottom of the via hole 21b is exposed by grinding the back surface of the substrate 21a and then 5 to 10 microns of Au is deposited on the back surface of the substrate by plating vapor deposition or the like to form the PHS.

As described above, according to the second embodiment of the present invention, the first patterning for the electrolytic plating which requires high precision is implemented by using a pattern of the positive resist applied onto the flat substrate before the via hole is formed, the metal film is applied to the entire surface by sputtering, which has a good covering characteristic, after the via hole is formed, the unnecessary part is covered with the resist using the above metal film as a feeding layer and then only the necessary part is covered with the metal film by electrolytic plating. Therefore, the plating pattern formed on the surface can be formed with high precision and a third, uniform metal film can be formed in the via hole.

Next, a third embodiment of the present invention will be described. FIGS. 3(a) to 3(j) are cross-sectional views showing process steps for forming a via hole in a method for manufacturing a semiconductor device in accordance with the third embodiment of the present invention.

In these figures, reference numeral 31a designates, for example, a GaAs semiconductor substrate having a front surface on which a high power output transistor or the like is formed. An electrode 40 of this high output transistor or the like on the front surface of the substrate 31a is connected to a heat sink layer formed on a back surface of the substrate 31a, opposite the front surface, through a via hole 31b. Reference numerals 32 and 34 designate a first resist and a second resist, respectively. Reference numeral 33 designates a first metal film formed by sputtering or the like. Reference numeral 25 designates a second metal film formed by electroless plating.

Figure 3A:
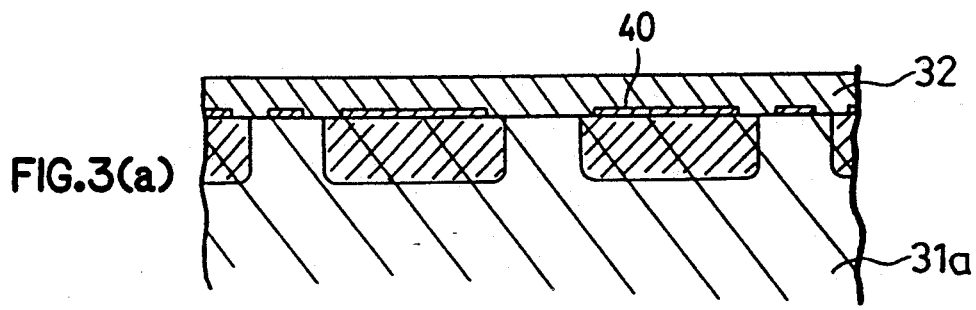
FIGS. 3(a) to 3(j) are cross-sectional views showing process steps for forming a via hole in a method for manufacturing a semiconductor device in accordance with a third embodiment of the present invention.
Figure 3B:
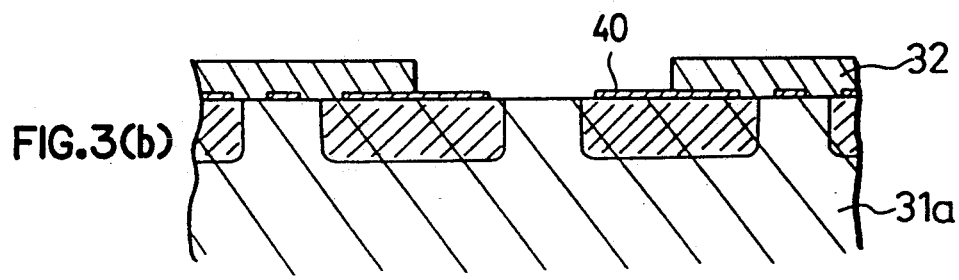
Figure 3C:
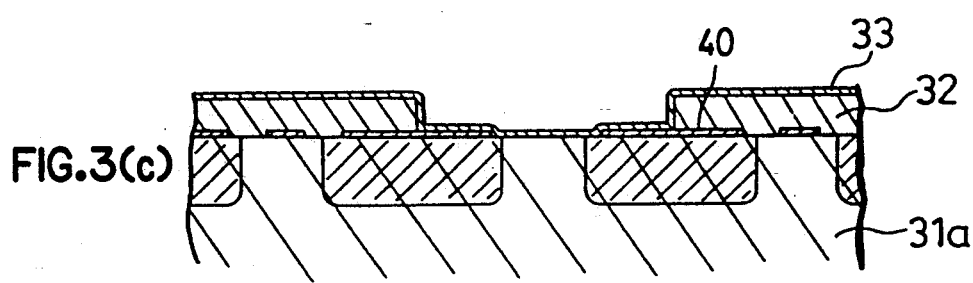
Figure 3D:
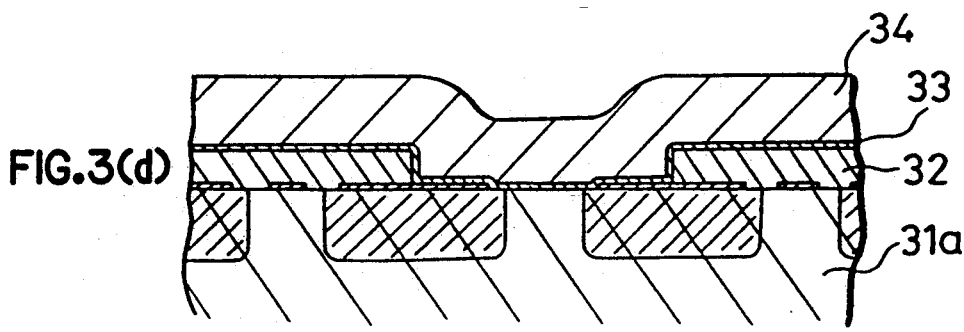
Figure 3E:
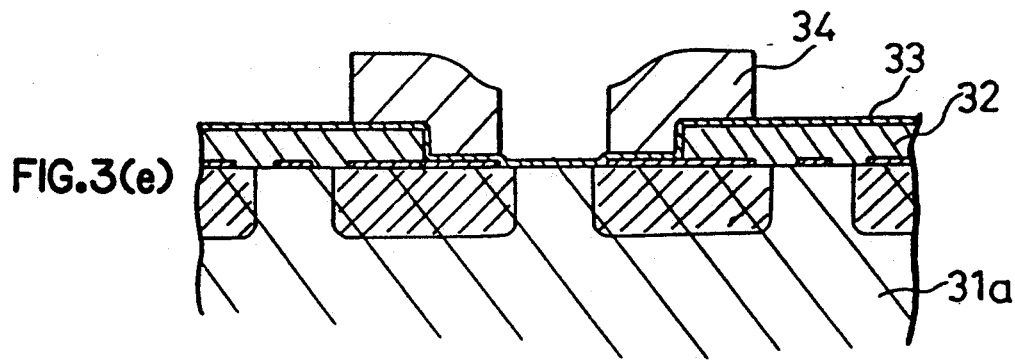
Figure 3F:
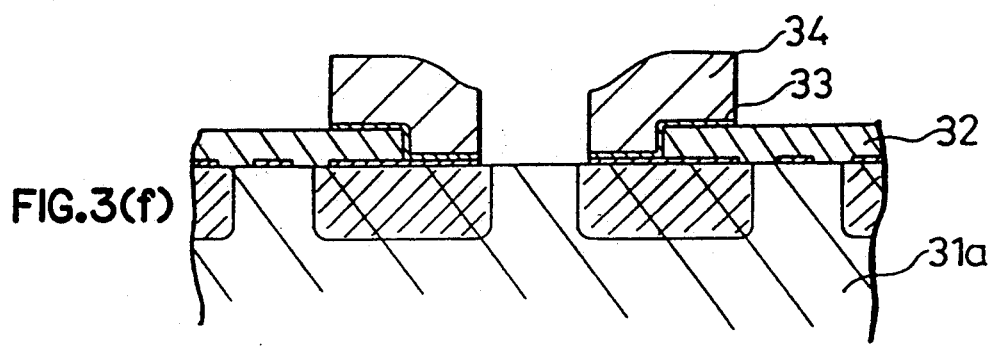
Figure 3G:
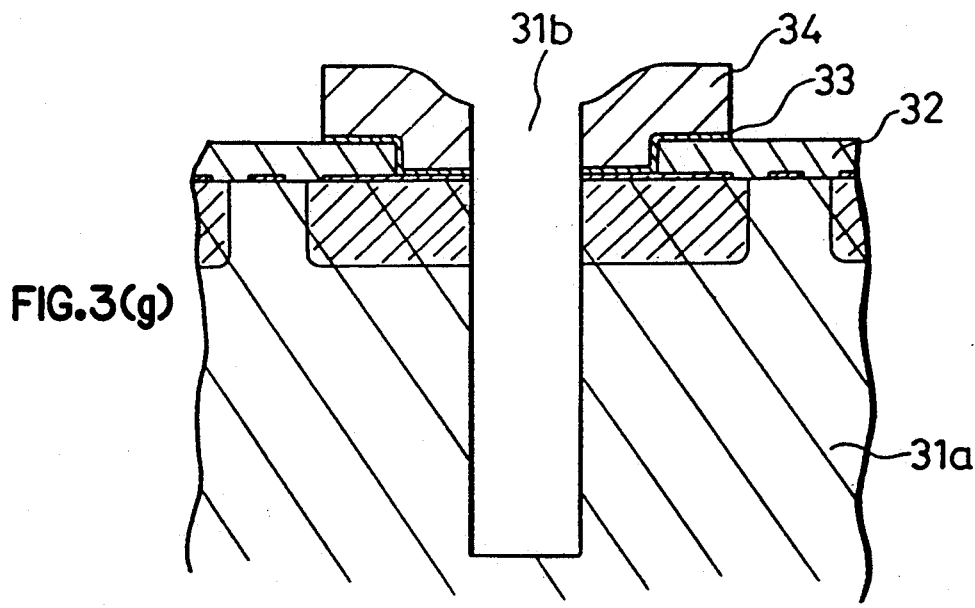
Figure 3H:
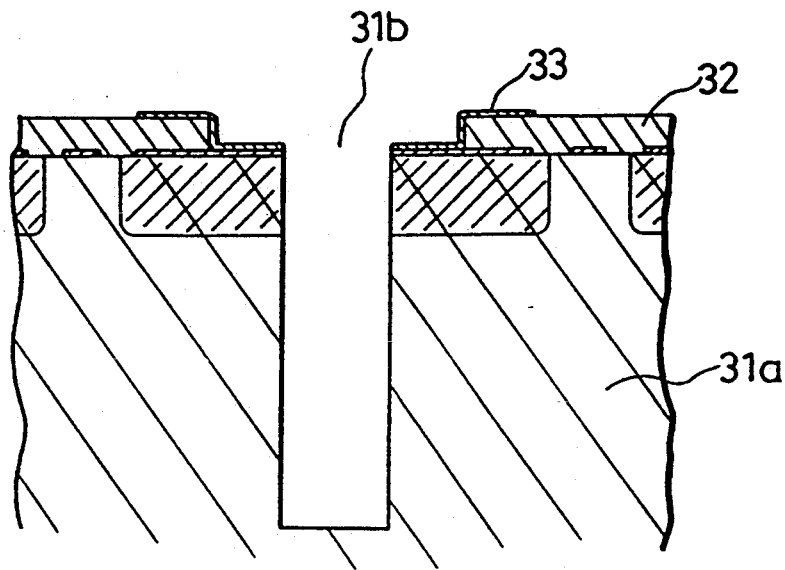
Figure 3I:
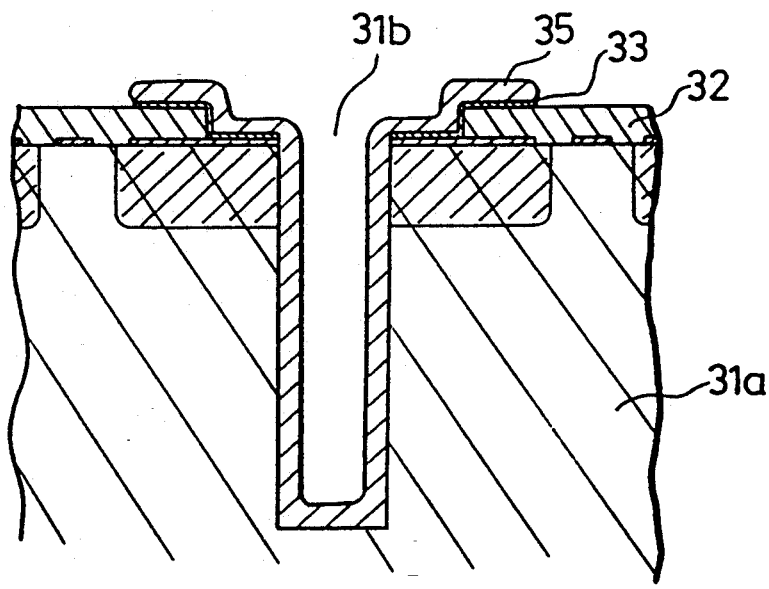
Figure 3J:
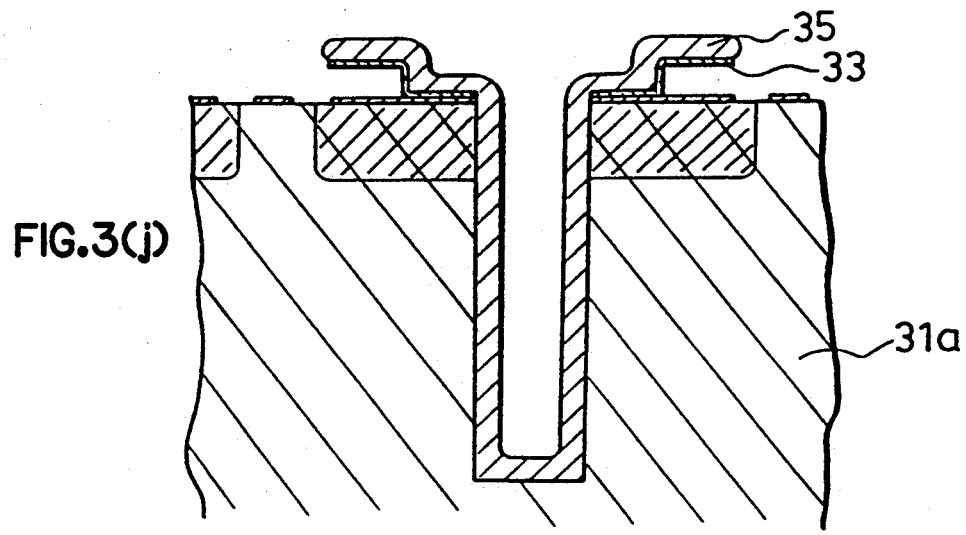

Next, process steps for forming the via hole in accordance with this embodiment will be described in reference to the drawings. As shown in FIG. 3(a), a positive resist serving as a first resist 32 is applied to the entire front surface of the GaAs substrate 31a including the electrode 40. Then, as shown in FIG. 3(b), the resist 32 is patterned by photolithography to form an opening at a predetermined region including a region of the front surface of the substrate 31a where the via hole is to be formed and part of the electrode 40. The diameter of the opening is approximately 30 microns. Thereafter, as shown in FIG. 3(c), a first metal film (laminated metal films of Ti/Au or the like) 33 is deposited on the entire surface, i.e., the exposed part of the substrate 31a, the exposed of the electrode 40, and the remaining resist 32, by sputtering or the like. Its thickness is approximately 5000 angstroms. Then, as shown in FIG. 3(d), a positive resist serving as a second resist 34 is applied to the entire surface of the metal film 33. The thickness of the resist 34 is 8 to 10 microns. Then, as shown in FIG. 3(e), the resist 34 is patterned by photolithography to form the pattern covering a region in the vicinity of a region where the via hole is to be formed. Then, as shown in FIG. 3(f), the first metal film exposed 33 on the surface is etched using the resist 34 as a mask. Then, as shown in FIG. 3(g), the substrate 31a is etched using the resist 34 and the resist 22 as a mask to form the via hole 31b whose depth is 30 to 100 microns. Then, the resist 34 is removed as shown in FIG. 3(h). Then, as shown in FIG. 3(i), a metal film 35 is formed by electrodes plating the inner surface of the via hole 31b and the surface of the metal film 33. The thickness of the metal film 35 is approximately 2 microns. Then, the second resist 32 is removed, resulting in a structure shown in FIG. 3(j). In order to obtain the device structure shown in FIG. 4, the bottom of the via hole 31b is exposed by etching the substrate 31a from the back surface and then 5 to 10 microns of Au is deposited on the back surface of the substrate by plating, vapor deposition or the like to form the PHS.

According to the third embodiment of the present invention, since the pattern of an electrode of an element electrically connected to the metal film disposed in the via hole is set determined by using the pattern of the positive resist applied to the flat substrate before the via hole is formed, it can be positioned with high precision.

As described above, according to the present invention, a metal pattern having an opening at a region where a via hole is to be formed and electrically connected to an electrode of an element electrically connected to the metal layer disposed on the back surface of the substrate through the via hole is formed. Thereafter, the via hole is formed and then the metal film connected to the metal pattern is formed on an internal surface of the via hole. As a result, the metal pattern can be formed using a positive resist on a flat substrate, whereby a highly precise pattern can be obtained.

In addition, according to the present invention, the metal film is formed by electrolytic plating after a feeding layer is formed on the entire surface of the wafer including an the internal surface of the via hole. As a result, a highly precise pattern can be obtained and the a thick, uniformed metal film can be formed in the via hole.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device having a via hole penetrating a semiconductor substrate and electrically and thermally connecting an electrode of an element disposed on a front surface of the substrate to a metal layer disposed on a back surface of the substrate comprising:
   applying a first resist to a front surface of a substrate where an element and an element electrode are present and patterning the first resist to include an opening at a location where a via hole is to be formed in the substrate and to expose a part of the electrode of the element;
   forming a first metal film on the front surface of the substrate where the front surface is not covered by the first resist, on the part of the electrode exposed in patterning the first resist, and on the first resist;
   applying a second resist on the first metal film;
   forming a first opening in the second resist encompassing the opening of the first resist but not including the location where the via hole is to be formed, thereby exposing part of the first metal film;
   plating a second metal film on the first metal in the opening of the second resist and then removing the second resist and the first metal film except where the first metal film is covered by the second metal film;
   forming a hole from the front surface of the substrate, extending into the substrate, and having an inside surface by etching the substrate using the second metal film and the first resist as a hole-forming mask; and
   plating a third metal film on the second metal film and on the inside surface of the hole.

2. A method for manufacturing a semiconductor device in accordance with claim 1 including forming a second opening in the second resist when the first opening is formed in the second resist.

3. A method for manufacturing a semiconductor device in accordance with claim 1 including removing part of the substrate from a back surface of the substrate opposite the front surface to expose the third metal film.

4. A method for manufacturing a semiconductor device having a via hole penetrating a semiconductor substrate and electrically and thermally connecting an electrode of an element disposed on a front surface of the substrate to a metal layer disposed on a back surface of the substrate comprising: applying a first resist to a front surface of a substrate where an element and an element electrode are present and patterning the first resist to include an opening at a location where a via hole is to be formed in the substrate and to expose a part of the electrode of the element;
   forming a first metal film on the front surface of the substrate where the front surface is not covered by the first resist, on the part of the electrode exposed in patterning the first resist, and on the first resist;
   applying a second resist on the first metal film;
   forming an opening in the second resist encompassing the opening of the first resist but not including the location where the via hole is to be formed, thereby exposing part of the first metal film;
   plating a second metal film on the first metal in the opening of the second resist and then removing the second resist and the first metal film except where the first metal film is covered by the second metal film;
   forming a hole at the front surface of the substrate, extending into the substrate, and having an inside surface by etching the substrate using the second metal film and the first resist as a hole-forming mask;
   forming a third metal film on the second resist, the second metal film, and the inside surface of the hole and applying a third resist on the third metal film;
   forming an opening in the third metal film at the via hole; and
   plating a fourth metal film on the third metal film at the opening of the third resist.

5. A method for manufacturing a semiconductor device in accordance with claim 4 including forming an opening in the second resist remote from the location where the hole is to be formed when the opening in the second resist encompassing the opening in the first resist is formed.

6. A method for manufacturing a semiconductor device in accordance with claim 4 including removing part of the substrate from a back surface of the substrate opposite the front surface to expose the third metal film.

7. A method for manufacturing a semiconductor device having a via hole penetrating a semiconductor substrate and electrically and thermally connecting an electrode of an element disposed on a front surface of the substrate to a metal layer disposed on a back surface of the substrate comprising:
   applying a first resist to a front surface of a substrate where an element and an element electrode are present and patterning the first resist to include an opening at a location where a via hole is to be formed in the substrate and to expose a part of the electrode of the element;
   forming a first metal film on the front surface of the substrate where the first surface is not covered by the first resist, on the part of the electrode exposed in pattern the first resist, and on the first resist;
   applying a second resist on the first metal film;

patterning the second resist so that the second resist remains at part of the opening of the first resist, excluding the location where the hole is to be formed and then removing the first metal film except where the first metal film is covered by the second resist;

forming the hole at the front surface of the substrate, extending into the substrate, and having an inside surface by etching the substrate using the second resist and the first resist as a mask and then removing the second resist to expose the first metal film under the second resist; and plating a second metal film on the first metal film and on the inside surface of the hole.

8. A method for manufacturing a semiconductor device in accordance with claim 7 including removing part of the substrate from a back surface of the substrate opposite the front surface to expose the second metal film.

* * * * *